(12) United States Patent
Hirai et al.

(10) Patent No.: US 9,844,939 B2
(45) Date of Patent: Dec. 19, 2017

(54) PIEZOELECTRIC DEVICE, LIQUID EJECTING HEAD, AND LIQUID EJECTING APPARATUS

(71) Applicant: SEIKO EPSON CORPORATION, Tokyo (JP)

(72) Inventors: Eiju Hirai, Azumino (JP); Motoki Takabe, Shiojiri (JP); Katsutomo Tsukahara, Shiojiri (JP); Yoichi Naganuma, Matsumoto (JP); Munehide Saimen, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/422,261

(22) Filed: Feb. 1, 2017

(65) Prior Publication Data

US 2017/0225464 A1    Aug. 10, 2017

(30) Foreign Application Priority Data

Feb. 5, 2016    (JP) .................................. 2016-021258

(51) Int. Cl.
| | |
|---|---|
| *B41J 2/14* | (2006.01) |
| *B41J 2/045* | (2006.01) |
| *H01L 41/09* | (2006.01) |
| *H01L 41/047* | (2006.01) |
| *H01L 41/053* | (2006.01) |

(52) U.S. Cl.
CPC ....... *B41J 2/14201* (2013.01); *B41J 2/04521* (2013.01); *B41J 2/14072* (2013.01); *H01L 41/0475* (2013.01); *H01L 41/053* (2013.01); *H01L 41/09* (2013.01); *B41J 2002/14491* (2013.01)

(58) Field of Classification Search
CPC ........................ B41J 2/14201; B41J 2/14072; B41J 2/04521; B41J 2002/14491; H01L 41/0475; H01L 41/09; H01L 41/053
See application file for complete search history.

(56) References Cited

U.S. PATENT DOCUMENTS 7,621,622 B2 * 11/2009 Kachi .................. B41J 2/14233
                                                          347/50
2012/0212547 A1    8/2012 Takemoto et al.
(Continued)

FOREIGN PATENT DOCUMENTS

JP    2012-171149    9/2012

*Primary Examiner* — Geoffrey Mruk
(74) *Attorney, Agent, or Firm* — Workman Nydegger

(57) ABSTRACT

A piezoelectric device includes an actuator substrate that includes a plurality of piezoelectric element rows having a plurality of piezoelectric elements, and a wiring substrate that is disposed so as to face the actuator substrate. The piezoelectric element rows include a common electrodes common to the plurality of the piezoelectric elements. The actuator substrate includes a plurality of first common wirings connected to each of the common electrodes of the plurality of the piezoelectric element rows. The wiring substrate includes a plurality of second common wirings connected to each of the first common wirings of the plurality of piezoelectric element rows, and a plurality of auxiliary wirings buried in a groove portion formed in the wiring substrate. The auxiliary wirings are connected to each of the second common wirings, and the plurality of auxiliary wirings are not connected to each other.

12 Claims, 11 Drawing Sheets

(56) References Cited

U.S. PATENT DOCUMENTS

2014/0063129 A1\* 3/2014 Kondo ............... H01L 41/0475
                                                    347/68
2015/0029270 A1   1/2015 Takemoto et al.

\* cited by examiner

PIEZOELECTRIC DEVICE, LIQUID EJECTING HEAD, AND LIQUID EJECTING APPARATUS

The entire disclosure of Japanese Patent Application No: 2016-021258, filed Feb. 5, 2016 is expressly incorporated by reference herein in its entirety.

BACKGROUND

1. Technical Field

The present invention relates to a piezoelectric device, a liquid ejecting head and a liquid ejecting apparatus.

2. Related Art

A representative example of a liquid ejecting head that ejects liquid droplets includes an ink jet recording head that ejects ink droplets. As the ink jet recording head, for example, there is known a device that includes a flow path forming substrate in which a pressure generating chamber communicating with a nozzle opening is formed, and a piezoelectric element disposed on one side of the flow path forming substrate, and in which ink droplets are ejected from the nozzle opening by causing a pressure change in ink in the pressure generating chamber by a piezoelectric element.

A wiring substrate is disposed so as to face the flow path forming substrate, and wiring disposed on the wiring substrate is connected to each of the piezoelectric elements. Specifically, the piezoelectric element includes an individual electrode individually disposed for each of active portions and a common electrode commonly disposed for a plurality of active portions, a driving signal is supplied to the individual electrode, and a bias voltage (vbs) is supplied to the common electrode (for example, refer to JP-A-2012-171149).

In a configuration having a plurality of piezoelectric element rows in which the piezoelectric elements are arranged in parallel in one direction, a supply wiring commonly connected to the common electrode of the piezoelectric element row is provided. That is, the bias voltage is supplied to a common electrode of a plurality of piezoelectric element rows by one supply wiring. An auxiliary wiring is connected to the supply wiring. By the auxiliary wiring, it is possible to lower an electric resistance value of the supply wiring.

The bias voltage applied to a common electrode of each of piezoelectric element rows is supplied by a common supply wiring in the piezoelectric element rows. In such a configuration, there is a possibility that a so-called electric crosstalk in which a change occurs in the drive of the other piezoelectric element row, in particular the power supply, depending on the number of piezoelectric elements driven simultaneously in one piezoelectric element row. Although an auxiliary wiring is connected to the supply wiring, this auxiliary wiring is also common to the piezoelectric element row. Therefore, there is a possibility that electric crosstalk may occur even by the auxiliary wiring. Due to the occurrence of the electric crosstalk, there is a problem in that variation in ejection characteristics of the ink droplets ejected by the piezoelectric element corresponding to the other piezoelectric element row, in particular, in a flight speed of the ink droplets, and in a size of the ink droplets occurs.

In a case where the auxiliary wiring is disposed on the surface of a wiring substrate on a flow path forming substrate side, as a result of forming the auxiliary wiring so as to satisfy a necessary resistance value, there is a possibility of contacting with the flow path forming substrate side due to the thickness of the auxiliary wiring or of discharging to the piezoelectric element, or the like. In order to avoid this, when an interval between the wiring substrate and the flow path forming substrate is increased beyond a certain level, a height of the ink jet recording head is increased, and downsizing cannot be achieved.

These problems are not limited to a piezoelectric device used in a liquid ejecting head such as an ink jet recording head, and are similarly present in the piezoelectric device used in another device.

SUMMARY

An advantage of some aspects of the invention is to provide a piezoelectric device, a liquid ejecting head, and a liquid ejecting apparatus that can realize downsizing by suppressing electric crosstalk.

According to an aspect of the invention, there is provided a piezoelectric device including an actuator substrate that includes a plurality of piezoelectric element rows having a plurality of piezoelectric elements, and a wiring substrate that is disposed so as to face the actuator substrate. The piezoelectric element rows include a common electrodes common to the plurality of piezoelectric elements. The actuator substrate includes a plurality of first common wirings connected to each of the common electrodes of the plurality of piezoelectric element rows. The wiring substrate includes a plurality of second common wirings connected to each of the first common wirings of the plurality of piezoelectric element rows, and a plurality of auxiliary wirings buried in a groove portion formed in the wiring substrate. The auxiliary wirings are connected to each of the second common wirings, and the plurality of auxiliary wirings are not connected to each other.

In the aspect, the auxiliary wiring is connected to each of the second common wirings, and the auxiliary wirings are not connected to each other. Thereby, it is possible to suppress occurrence of electric crosstalk between the piezoelectric element rows via the auxiliary wiring. Furthermore, the auxiliary wiring is buried in the groove portion of the wiring substrate. Accordingly, it is possible to reduce the interval between the actuator substrate and the wiring substrate, compared to a case where the auxiliary wiring is formed on the wiring substrate without being buried in the groove portion. Thereby, it is possible to reduce the size of the piezoelectric device in the height direction.

It is preferable that the second common wiring include a first principal surface side wiring disposed on a first principal surface of the wiring substrate opposite to the actuator substrate, a second principal surface side wiring disposed on a second principal surface of the wiring substrate on the actuator substrate side, and a through wiring formed in a through hole penetrating the wiring substrate in a thickness direction and connected to the first principal surface side wiring and the second principal surface side wiring, and the auxiliary wiring be disposed on at least one of the first principal surface or the second principal surface and connected to the first principal surface side wiring or the second principal surface side wiring. Accordingly, since the first common wiring is connected to the second common wiring via the through wiring, it is possible to reduce the space for forming the first common wiring on the actuator substrate, and to reduce the size of the actuator substrate.

It is preferable that the second principal surface side wiring include a common core portion that is disposed on the second principal surface and extended in a first direction, and a common wiring portion that covers at least a portion of the common core portion and is connected to the first common wiring, and the auxiliary wiring be disposed on the second principal surface and connected to the common wiring portion. Accordingly, since the common wiring portion also serves as a function of connecting the auxiliary wiring and the supply wiring, it is not necessary to dispose a separate wiring for connecting the auxiliary wiring to the supply wiring, so that it is possible to reduce the cost of manufacturing and members.

It is preferable that the actuator substrate include a plurality of first individual wirings that are connected to each of a plurality of individual electrodes disposed for each of the piezoelectric elements, the wiring substrate include a plurality of second individual wirings that are connected to each of the plurality of first individual wirings, the second individual wiring include an individual core portion that is disposed on the second principal surface and extended in the first direction, and an individual wiring portion that covers at least a portion of the individual core portion and is connected to the first individual wiring, the first individual wirings connected to the plurality of piezoelectric elements for each of the piezoelectric element rows be connected to the individual wiring portions, and the second principal surface side wiring cover at least a portion of the individual core portion, and include the common wiring portion connected to the first common wiring. Accordingly, it is possible to reduce the interval between the piezoelectric element rows, and to downsize the piezoelectric device to that extent.

According to another aspect of the invention, there is provided a liquid ejecting head including the piezoelectric device according to above aspect. Accordingly, the liquid ejecting head in which the ejection characteristics of liquid is improved by suppressing electric crosstalk and capable of realizing downsizing is provided.

According to still another aspect of the invention, there is provided a liquid ejecting apparatus including the liquid ejecting head according to above aspect. Accordingly, the liquid ejecting apparatus in which the ejection characteristics of liquid is improved by suppressing electric crosstalk and capable of realizing downsizing is provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

An embodiment of the invention will be described in detail. In the embodiment, an ink jet recording head that ejects ink as an example of a liquid ejecting head (hereinafter, simply refer to as a recording head) will be described.

Figure 1:
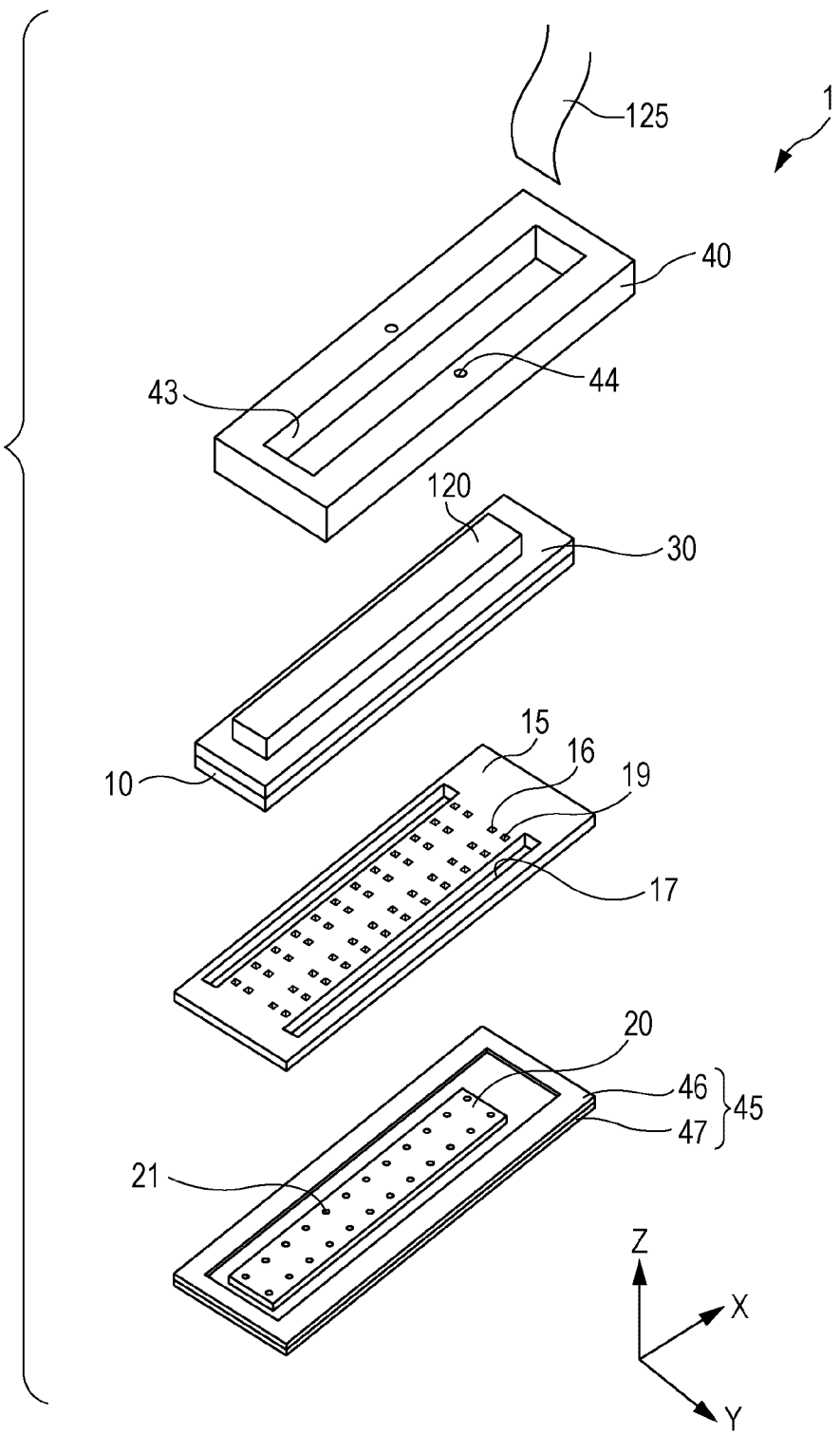
FIG. 1 is an exploded perspective view of a recording head according to a first embodiment.
Figure 2:
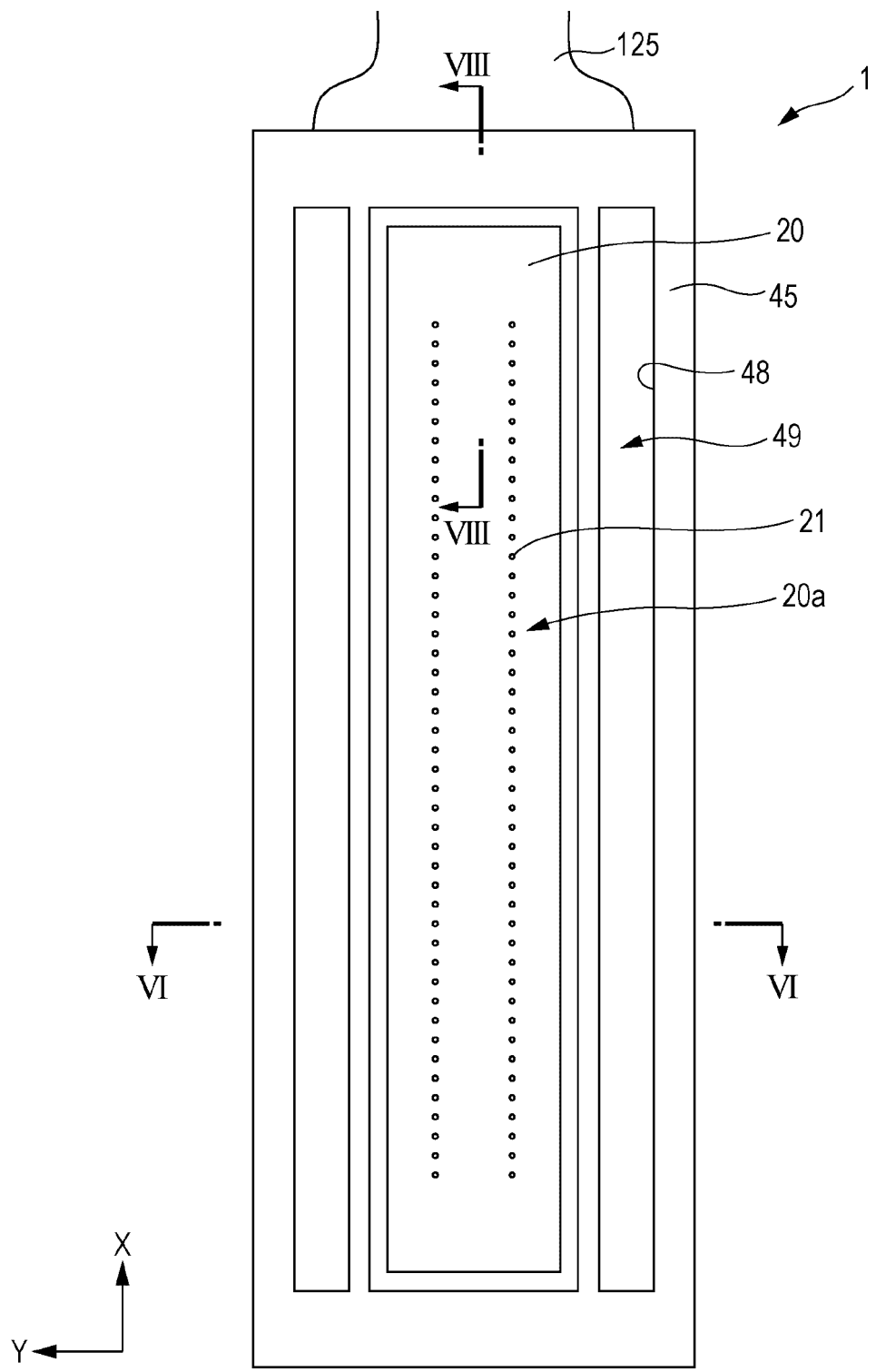
FIG. 2 is a plan view of the recording head according to the first embodiment.
Figure 3:
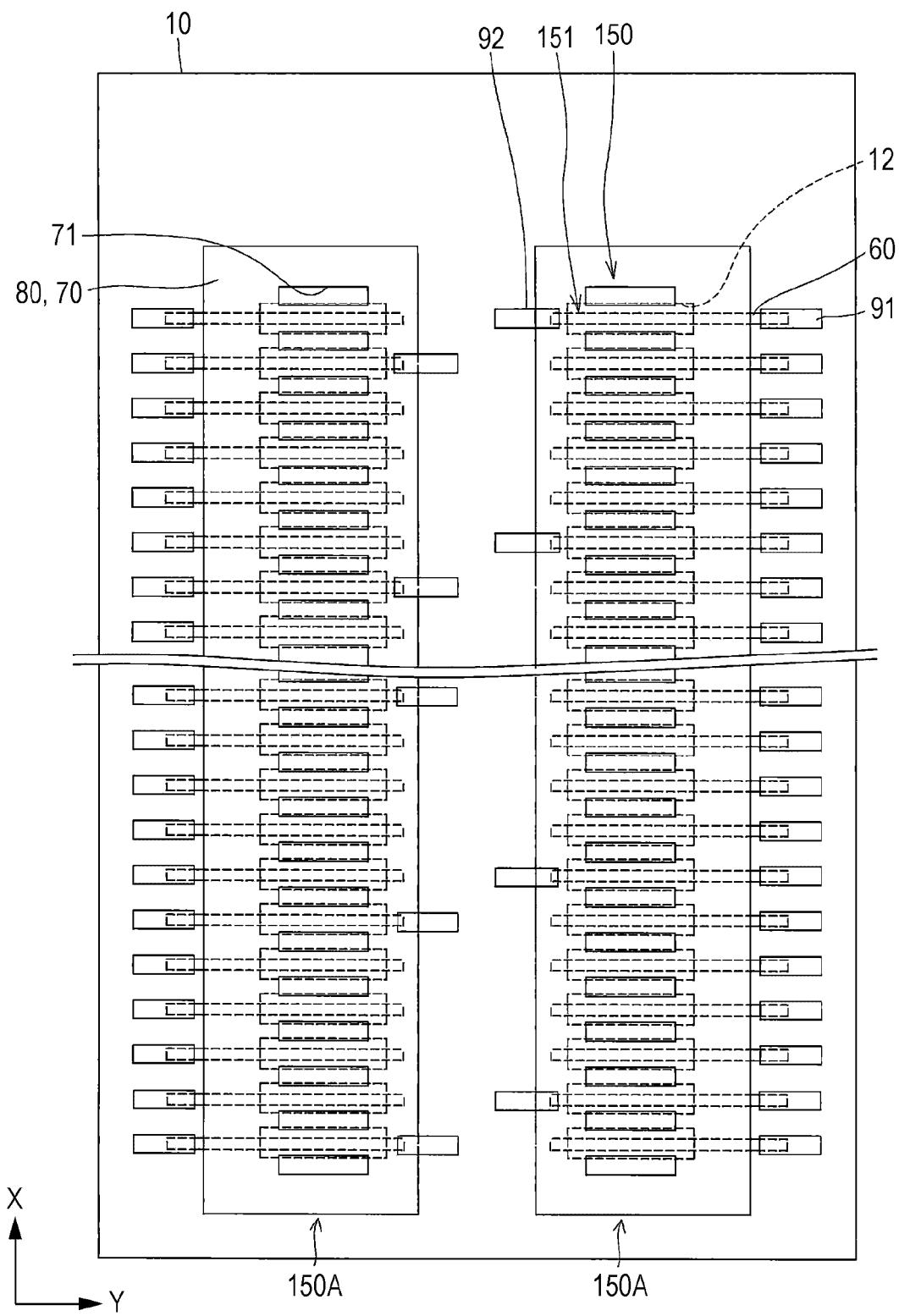
FIG. 3 is a plan view of a flow path forming substrate of the recording head according to the first embodiment.
Figure 4:
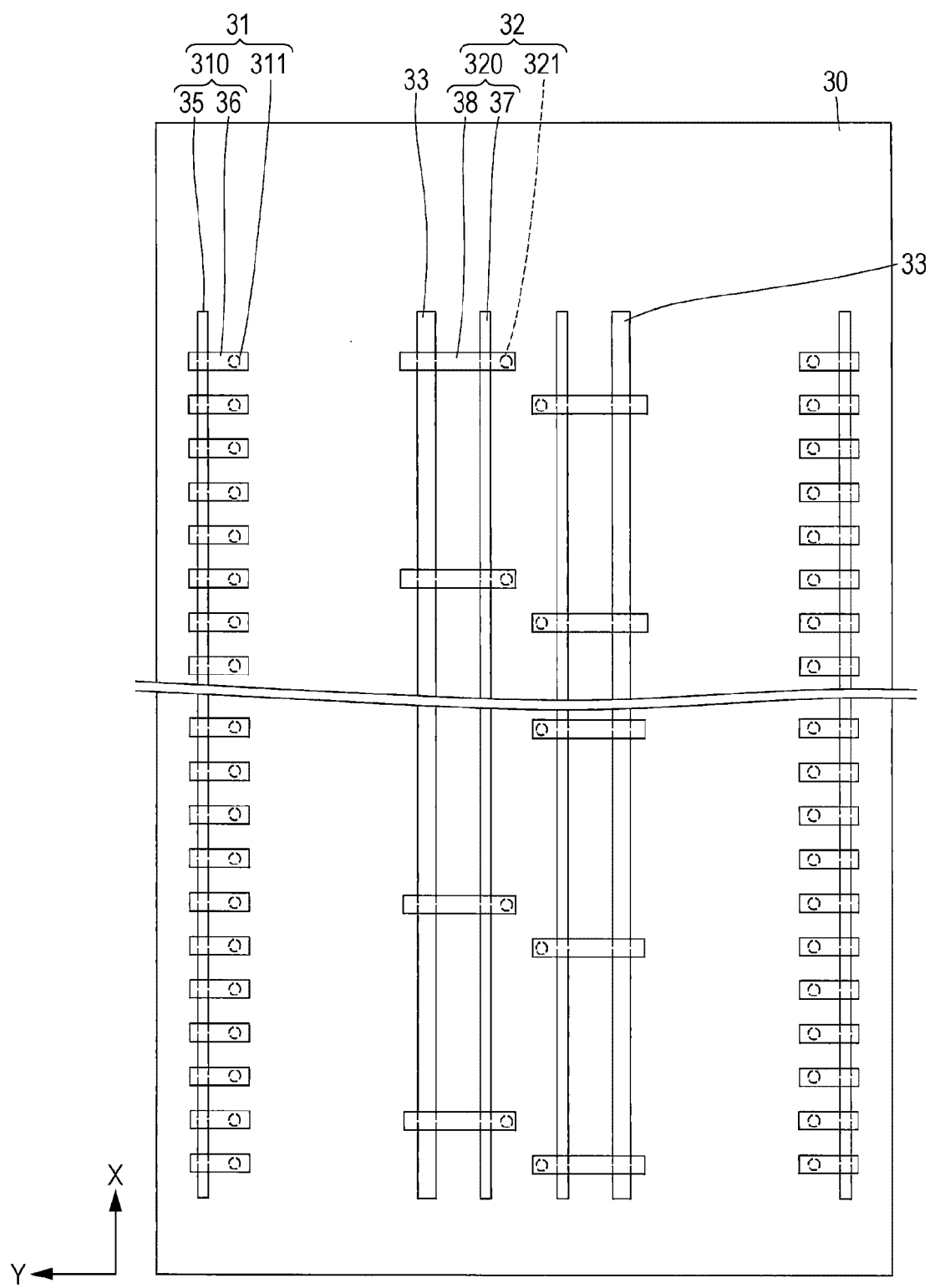
FIG. 4 is a plan view of a wiring substrate of the recording head according to the first embodiment.
Figure 5:
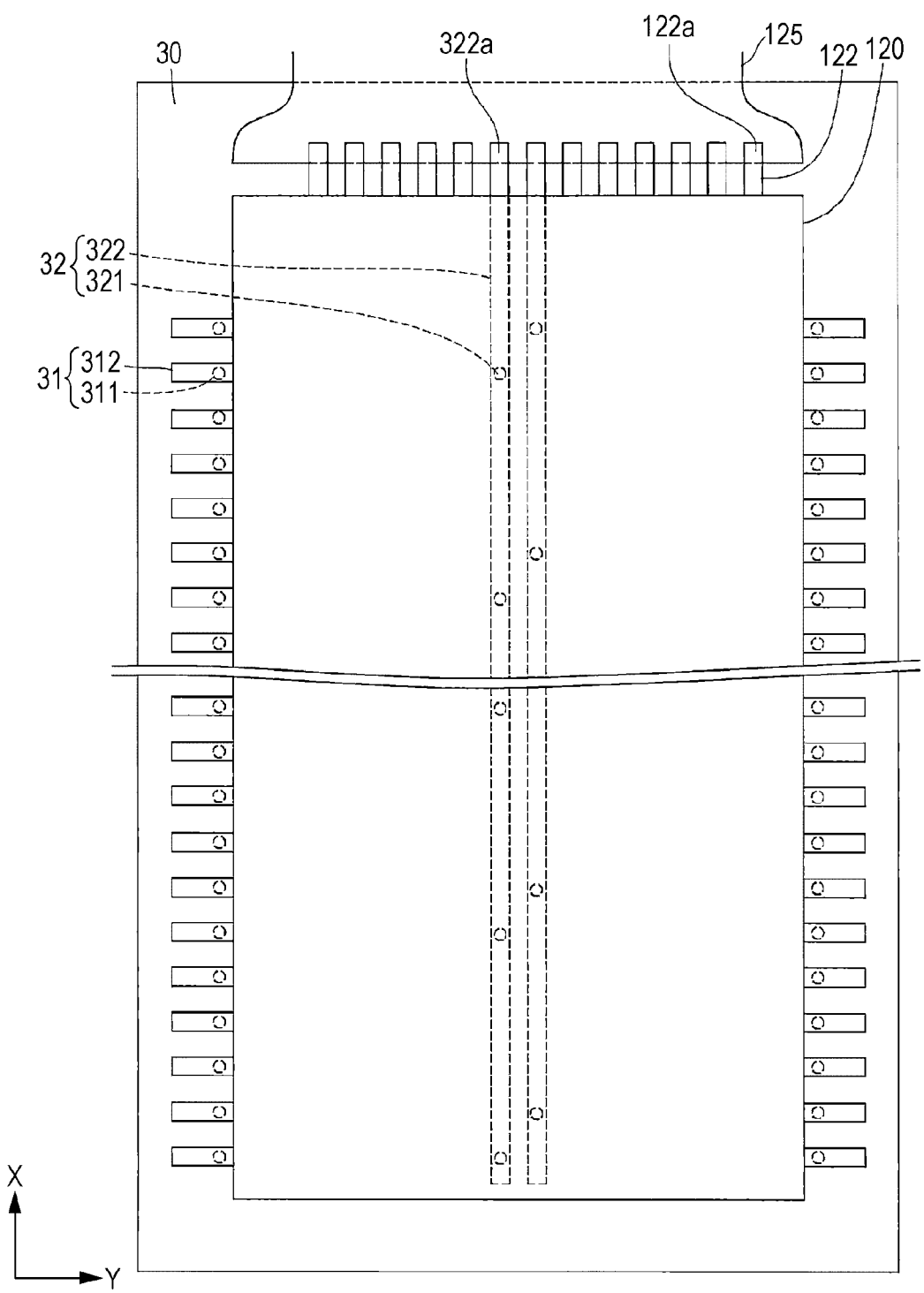
FIG. 5 is a plan view of the wiring substrate of the recording head according to the first embodiment.
Figure 6:
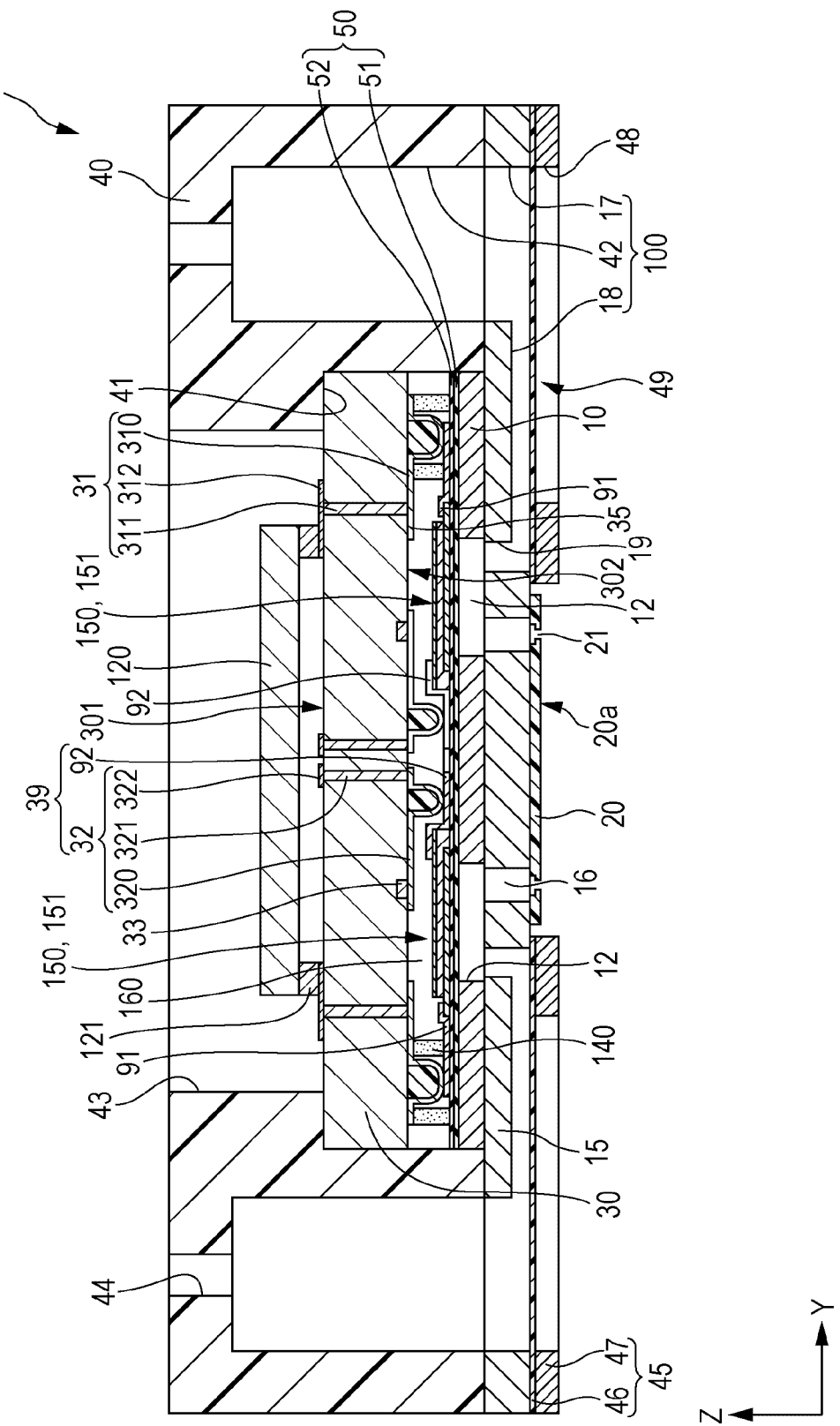
FIG. 6 is a cross-sectional view taken along line VI-VI of FIG. 2.
Figure 7:
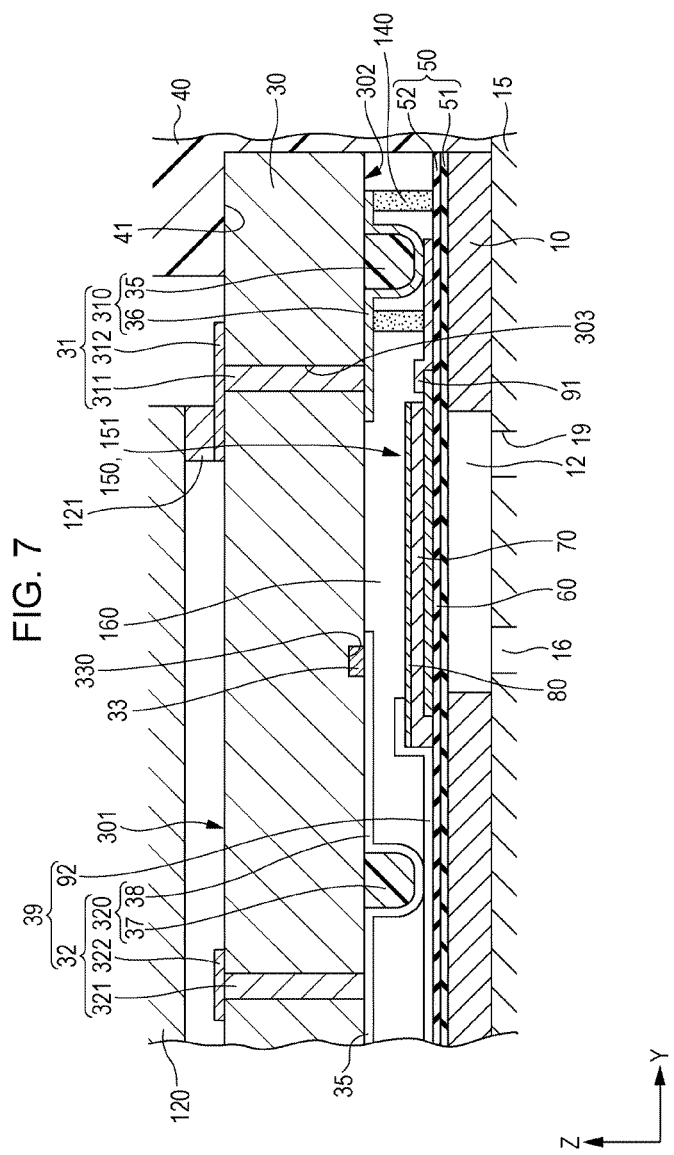
FIG. 7 is an enlarged view of FIG. 6.
Figure 8:
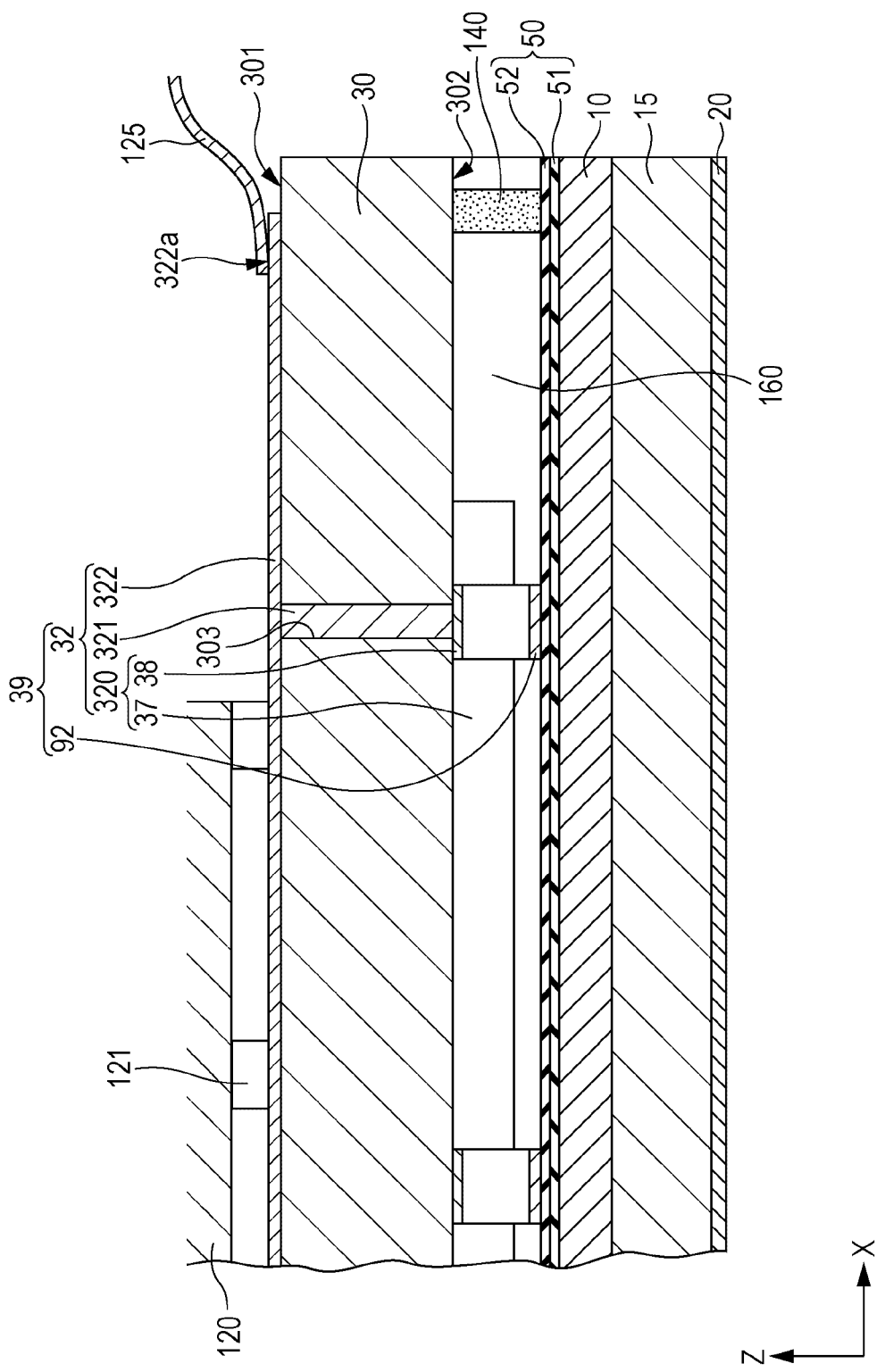
FIG. 8 is a cross-sectional view taken along line VIII-VIII of FIG. 2.

FIG. 1 is an exploded perspective view of a recording head, FIG. 2 is a plan view of the recording head, FIG. 3 is a plan view of a flow path forming substrate of the recording head, FIG. 4 is a plan view of a wiring substrate of the recording head, FIG. 5 is a plan view of the wiring substrate of the recording head, FIG. 6 is a cross-sectional view taken along line VI-VI of FIG. 2, FIG. 7 is an enlarged view of FIG. 6, and FIG. 8 is a cross-sectional view taken along line VIII-VIII of FIG. 2. FIG. 2 and FIG. 4 are plan views of a lower surface side (liquid ejecting surface 20a side) of the recording head 1, FIG. 3 and FIG. 5 are plan views of an upper surface side (case member 40 side) of the recording head 1.

The recording head 1 is provided with a plurality of members, such as a flow path forming substrate 10, a communicating plate 15, a nozzle plate 20, a wiring substrate 30, and a compliance substrate 45.

The flow path forming substrate 10 is an example of an actuator substrate in which a piezoelectric element is disposed. Materials of the flow path forming substrate 10 are metals such as stainless steel and Ni, ceramic materials represented by $ZrO_2$ or $Al_2O_3$, glass-ceramic materials, and oxides such as MgO and $LaAlO_3$. In the embodiment, the flow path forming substrate 10 is formed of a silicon single crystal substrate. In the flow path forming substrate 10, by performing anisotropic etching from one side, pressure chambers 12 that are partitioned by a plurality of partition walls are arranged in parallel along a direction where a plurality of nozzles 21 for ejecting ink are arranged in parallel.

A direction parallel to the pressure chamber 12 is referred to as the parallel direction of pressure chamber 12 or as a first direction X. Rows in which the pressure chambers 12 are arranged in the first direction X are disposed as a plurality of rows in the flow path forming substrate 10, and two rows are disposed in the embodiment. The direction in which plurality rows of the pressure chamber 12 are disposed is referred to as a second direction Y. Furthermore, a direction intersecting both of the first direction X and the second direction Y is referred to as a third direction Z in the embodiment. Coordinate axes illustrated in each drawing represent the first direction X, the second direction Y, and the third direction Z. The direction of an arrow is referred to as a positive (+) direction, and the direction opposite to the direction of the arrow is referred to as a negative (−) direction. Although the directions (X, Y, and Z) are orthogonal to each other in the embodiment, the arrangement of the directions in each configuration is not necessarily limited to an orthogonal arrangement.

In one side of the flow path forming substrate 10 (side opposite to the wiring substrate 30 (−Z direction side)), the communicating plate 15 is disposed. In a side opposite to the flow path forming substrate 10 of the communicating plate 15, the nozzle plate 20 having the nozzle 21 is disposed.

In the communicating plate 15, the pressure chamber 12 and a nozzle communicating path 16 communicating with the nozzle 21 are disposed. The communicating plate 15 has a larger area than the flow path forming substrate 10, and the nozzle plate 20 has a smaller area than the flow path forming substrate 10. Since the nozzle 21 of the nozzle plate 20 and the pressure chamber 12 are separated by disposing the communicating plate 15 in this manner, ink that is in the pressure chamber 12 is hardly affected by an increase in viscosity due to evaporation of water in the ink as a result of ink around the nozzle 21. Since the nozzle plate 20 is sufficient to cover only the opening of the nozzle communicating path 16 that enables the pressure chamber 12 and the nozzle 21 to communicate with each other, the area of the nozzle plate 20 can be relatively small, and it is possible to reduce costs. In the embodiment, a surface onto which the ink droplets are ejected (−Z side surface of the nozzle plate 20) is referred to as a liquid ejecting surface 20a.

The communicating plate 15 is disposed with a first manifold portion 17 forming a portion of a manifold 100 and a second manifold portion 18.

The first manifold portion 17 is disposed to pass through the communicating plate 15 in a thickness direction (a stacking direction of the communicating plate 15 and the flow path forming substrate 10). The second manifold portion 18 does not pass through the communicating plate 15 in the thickness direction and is disposed to open to the nozzle plate 20 side of the communicating plate 15.

Furthermore, in the communicating plate 15, a supply communicating path 19 that communicates with one edge of the pressure chamber 12 in the second direction Y is independently disposed for each of the pressure chambers 12. The supply communicating path 19 communicates with the second manifold portion 18 and the pressure chamber 12.

As a material of the communicating plate 15 can use a metal such as stainless steel or Ni, or a ceramic such as a zirconium-based ceramic. The communicating plate 15 is preferably made of a material having a linear expansion coefficient equivalent to that of the flow path forming substrate 10. That is, in a case in which a material having a linear expansion coefficient significantly different from that of the flow path forming substrate 10 is used as the communicating plate 15, heating and cooling may cause bending to occur due to a difference in the linear expansion coefficient between the flow path forming substrate 10 and that of the communicating plate 15. In the embodiment, by using the same material as the flow path forming substrate 10, that is, a silicon single crystal substrate as the communicating plate 15, the occurrence of bending, cracking, and peeling due to heat can be suppressed.

The nozzle 21 that communicates with each of the pressure chambers 12 via the nozzle communicating path 16 is formed in the nozzle plate 20. The nozzles 21 are arranged in parallel in the first direction X, and the rows of the nozzle 21 arranged in parallel in the first direction X form two rows in the second direction Y.

As a material of a nozzle plate 20 can use, for example, a metal such as stainless steel (SUS), an organic material such as polyimide resin, or the silicon single crystal substrate. By using the silicon single crystal substrate as the nozzle plate 20, the linear expansion coefficient of the nozzle plate 20 and the communicating plate 15 is equivalent. Therefore, the occurrence of bending due to heating or cooling, or the occurrence of cracking and peeling due to heat can be suppressed.

A diaphragm 50 is formed on a side opposite to the communicating plate 15 of the flow path forming substrate 10 (on the wiring substrate 30 side (+Z direction side)). In the embodiment, an elastic film 51 formed of a silicon oxide disposed on the flow path forming substrate 10 side and an insulator film 52 formed of a zirconium oxide disposed on the elastic film 51 are disposed as the diaphragm 50. A liquid flow path of the pressure chamber 12 is formed by performing anisotropic etching on the flow path forming substrate 10 from one side (surface side to which the communicating plate 15 is joined), and the other side of the liquid flow path of the pressure chamber 12 is defined by the elastic film 51. As a matter of course, the diaphragm 50, without being specifically limited thereto, may be disposed with any one of the elastic film 51 and the insulator film 52 and may be disposed with another film.

The piezoelectric element 150 is disposed to cause a pressure change in the ink in the pressure chamber 12 of the embodiment on the diaphragm 50 of the flow path forming substrate 10.

The piezoelectric element 150 has a first electrode 60 serving as a conductive electrode, a piezoelectric layer 70, and a second electrode 80 serving as a conductive electrode, which are sequentially stacked from the diaphragm 50 side. The first electrode 60 forming the piezoelectric element 150 is separated for each of the pressure chambers 12 and forms the individual electrodes independently for each of the active portions 151 that are the substantial driving units of the piezoelectric element 150. A material of the first electrode 60, without being specifically limited as long as the material is a metal material, may preferably be used, for example, platinum (Pt), iridium (Ir), or the like.

The piezoelectric layer 70 is disposed continuously over the first direction X so that the second direction Y is a predetermined width. The edge of the piezoelectric layer 70 on one edge side of the pressure chamber 12 in the second direction Y (side opposite to the manifold 100) is positioned further toward an outer side than the edge of the first electrode 60. That is, the edge of the first electrode 60 is covered by the piezoelectric layer 70. The edge of the piezoelectric layer 70 on the other side that is the manifold 100 side of the pressure chamber 12 in the second direction Y is positioned further toward an inner side than the edge of the first electrode 60 (pressure chamber 12 side), and the edge of the manifold 100 side of the first electrode 60 is not covered by the piezoelectric layer 70.

The piezoelectric layer 70 is formed of a piezoelectric material of the oxide having a polarization structure formed on the first electrode 60 and, for example, can be formed of a perovskite-type oxide represented by the general formula $ABO_3$. The perovskite-type oxide used in the piezoelectric layer 70, for example, can be a lead-based piezoelectric material containing lead or a lead-free piezoelectric material containing no lead.

The recessed portions 71 are formed at positions corresponding to each of the partition walls between the pressure chambers 12 in the piezoelectric layer 70. By disposing the recessed portion 71 in the piezoelectric layer 70 in this manner, the piezoelectric element 150 can be satisfactorily displaced.

The second electrode 80 is disposed on the side opposite to the first electrode 60 of the piezoelectric layer 70 and forms common electrodes common to a plurality of active portions 151. In the embodiment, although the second electrode 80 is disposed in the recessed portion 71 of the piezoelectric layer 70, without being specifically limited thereto, the second electrode 80 may not be disposed in the recessed portion 71.

The piezoelectric element 150 configured with the first electrode 60, the piezoelectric layer 70, and the second electrode 80 is displaced by applying a voltage between the first electrode 60 and the second electrode 80. That is, by applying the voltage between both electrodes, a piezoelectric strain occurs in the piezoelectric layer 70 interposed between the first electrode 60 and the second electrode 80. When applying the voltage to both electrodes, a portion where the piezoelectric strain occurs in the piezoelectric layer 70 is referred to as an active portion 151.

As described above, the piezoelectric element 150 is the individual electrode by disposing independently the first electrode 60 for each of the plurality of active portions 151, and is the common electrode by disposing continuously the second electrode 80 over the plurality of active portions 151. As a matter of course, without being limited to this aspect, the piezoelectric element 150 may be the common electrode by disposing continuously the first electrode 60 over the plurality of active portions 151, and may be the individual electrode by disposing independently the second electrode 80 for each of the active portions 151. As the diaphragm 50, without disposing the elastic film 51 and the insulator film 52, only the first electrode 60 may act as the diaphragm.

The above-described piezoelectric elements 150 are arranged in parallel plural elements to form piezoelectric element rows 150A. The piezoelectric element rows 150A means one in which a plurality of piezoelectric elements 150 having the common second electrodes 80 are arranged in parallel. In other words, the second electrodes 80 are not connected to each other between different piezoelectric element rows 150A.

The piezoelectric element rows 150A of the embodiment are one in which the plurality of piezoelectric elements 150 having the common second electrodes 80 are arranged in parallel in the first direction X. Two rows of piezoelectric element rows 150A are arranged in parallel in the second direction Y. The active portions 151 of each of the piezoelectric elements 150 configuring the piezoelectric element rows 150A are arranged in parallel in the first direction X corresponding to the pressure chamber 12. Rows of the active portions 151 arranged in parallel in the first direction X are arranged two rows in the second direction Y.

As a matter of course, the piezoelectric element rows 150A are not limited to one in which the piezoelectric elements 150 are arranged in parallel along the first direction X in this manner. The piezoelectric element rows 150A may be formed from the piezoelectric elements 150 arranged in parallel along a certain direction.

The flow path forming substrate 10 is provided with a first individual wiring 91 and a first common wiring 92.

The first individual wiring 91 is a lead electrode respectively connected to each of the first electrodes 60 of the piezoelectric elements 150. Each of the first individual wirings 91 is drawn to the outside of the piezoelectric element rows 150A in the second direction Y from each of the first electrodes 60.

The first common wiring 92 is the lead electrode connected to the second electrode 80 common to the piezoelectric elements 150 of each of the piezoelectric element rows 150A. In the embodiment, the plurality of first common wirings 92 are connected to the second electrode 80 at a ratio of one to the plurality of piezoelectric elements 150 in each of the piezoelectric element rows 150A. As a matter of course, the number of the first common wirings 92 is not specifically limited. Each of the first common wirings 92 is drawn from each of the second electrodes 80 to the inside of the piezoelectric element rows 150A in the second direction Y. The first common wiring 92 of one piezoelectric element row 150A and the first common wiring 92 of the other piezoelectric element row 150A are not electrically connected to each other.

The wiring substrate 30 disposed so as to face the flow path forming substrate 10 is joined to the surface of the flow path forming substrate 10 on the piezoelectric element 150 side. The wiring substrate 30 has substantially the same size as the flow path forming substrate 10.

The wiring substrate 30 is formed of the same material as the flow path forming substrate 10, in the embodiment, a silicon single crystal substrate. A surface (+Z) of the wiring substrate 30 on the side opposite to the flow path forming substrate 10 is referred to as a first principal surface 301, and a surface (−Z) of the wiring substrate 30 on the flow path forming substrate 10 side is referred to as a second principal surface 302. A driving circuit 120 such as a driving IC, which is a driving element for outputting a signal for driving the piezoelectric element 150, is mounted on the first principal surface 301 of the wiring substrate 30.

Such the wiring substrate 30 is disposed so that the first direction X which is the parallel direction of the active portions 151 of each row of the piezoelectric element 150 is elongated. That is, the wiring substrate 30 is arranged so that the first direction X is the longitudinal direction and the second direction Y is the short direction.

The wiring substrate 30 is provided with a second individual wiring 31, a second common wiring 32, and an auxiliary wiring 33.

The second individual wiring 31 is a wiring connected to each of the plurality of first individual wirings 91. The second individual wiring 31 of the embodiment is provided with an individual bump wiring 310, an individual through wiring 311, and an individual surface wiring 312.

One individual bump wiring 310 has one individual core portion 35 and a plurality of individual wiring portions 36 covering at least a portion of the surface of the individual core portion 35. In the embodiment, two individual bump wirings 310 are disposed corresponding to the two rows of piezoelectric element rows 150A.

The individual core portion 35 is formed continuously in a straight line along the first direction X on one surface of the wiring substrate 30. Two individual core portions 35 are disposed in total, one for each outside of the two rows of piezoelectric element rows 150A in the second direction Y.

The individual core portion 35 is formed of, for example, a resin material with elasticity. The resin material is a photosensitive insulating resin such as a polyimide resin, an acrylic resin, a phenol resin, a silicone resin, a silicone modified polyimide resin, an epoxy resin, or a thermosetting insulating resin. The individual core portion 35 can be formed by a photolithography technique or an etching technique.

The individual core portion 35 is formed in a substantially semi-cylindrical shape before connecting the wiring substrate 30 and the flow path forming substrate 10. Here, the semi-cylindrical shape means a columnar shape in which the inner surface (bottom surface) in contact with the wiring substrate 30 is flat and the outer surface side which is a non-contact surface is curved surface. Specifically, the substantially semi-cylindrical shape includes shapes in which a cross section is substantially semicircular, substantially semielliptical, substantially trapezoidal, or the like.

The individual core portion 35 is pressed so that the wiring substrate 30 and the flow path forming substrate 10 are relatively close to each other. Therefore, a tip shape thereof elastically deforms so as to follow the surface shape of the first individual wiring 91. Thereby, even if the wiring substrate 30 and the flow path forming substrate 10 have bending or undulation, the individual core portion 35 deforms following the bending or the undulation. Therefore, it is possible to surely connect the individual wiring portion 36 and the first individual wiring 91.

The individual wiring portion 36 extends along the second direction Y on the second principal surface 302 of the wiring substrate 30. One end side of the individual wiring portion 36 covers the individual core portion 35 and the other end side is connected to the individual through wiring 311 described later. The individual wiring portions 36 are arranged in parallel plural portions along the first direction X, and each of the individual wiring portions 36 is arranged so as to face the first individual wiring 91.

The individual through wiring 311 is connected to each of the individual wiring portions 36 of the individual bump wiring 310. Specifically, a through hole 303 is disposed in the wiring substrate 30, corresponding to each of the individual wiring portions 36, and the individual through wiring 311 is formed in each of the through holes 303. Each of the individual wiring portions 36 is electrically connected to each of the individual through wirings 311.

The through hole 303 can be formed by performing laser processing, drill processing, inductively coupled plasma (ICP) processing, etching processing, sandblasting processing, or the like on the wiring substrate 30. The individual through wiring 311 is formed of a metal such as copper (Cu) and can be formed by electrolytic plating, electroless plating or the like.

The individual surface wirings 312 are a plurality of wirings disposed for each of the individual through wirings 311 on the first principal surface 301 side of the wiring substrate 30. Each of the individual surface wirings 312 are connected to the individual through wiring 311 and each of terminals 121 disposed on the driving circuit 120. The material of the individual surface wiring 312 is not specifically limited and may be formed of a conductive material. The production method thereof is also not specifically limited, but the individual surface wiring 312 can be formed, for example, by a sputtering method or the like.

The second individual wiring 31 is provided with the individual bump wiring 310, the individual through wiring 311, and the individual surface wiring 312, which is electrically connected in this manner. A plurality of second individual wirings 31 are disposed for each of the plurality of piezoelectric elements 150. The second individual wiring 31 and the first individual wiring 91 connected to the second individual wiring 31 form individual wiring, and a driving signal is supplied from the driving circuit 120 to the first electrode 60 of each of the piezoelectric elements 150 via the individual wiring.

The second common wiring 32 is a wiring connected to the first common wiring 92 of each of the plurality of piezoelectric element rows 150A. The second common wiring 32 of the embodiment is provided with a common bump wiring 320, a common through wiring 321, and a common surface wiring 322. The common bump wiring 320 is an example of a second principal surface side wiring of an aspect, the common through wiring 321 is an example of the through wiring of the aspect, and the common surface wiring 322 is an example of a first principal surface side wiring of the aspect.

One common bump wiring 320 includes one common core portion 37, and a plurality of common wiring portions 38 formed so as to cover the common core portion 37. In the embodiment, two common bump wirings 320 are disposed corresponding to the two rows of piezoelectric element rows 150A.

The common core portion 37 is formed continuously in a straight line along the first direction X on one surface of the wiring substrate 30. Two common core portions 37 are disposed between two rows of piezoelectric element rows 150A. The shape and the material of the common core portion 37 are the same as those of the individual core portion 35.

The common wiring portion 38 extends along the second direction Y on the second principal surface 302 of the wiring substrate 30. One end side of the common wiring portion 38 covers the common core portion 37 and the other end side is connected to the common through wiring 321 described later. The common wiring portions 38 are arranged in parallel plural portions along the first direction X, and each of the common wiring portions 38 is arranged so as to face the first common wiring 92.

In the embodiment, one common bump wiring 320 is disposed corresponding to one piezoelectric element row 150A. Specifically, each of the common wiring portions 38 of one common bump wiring 320 is disposed so as to be connected to each of the first common wiring 92 disposed in one piezoelectric element row 150A.

Such common bump wiring 320 also has the same functions and effects as the individual bump wiring 310. That is, the common core portion 37 is pressed so that the wiring substrate 30 and the flow path forming substrate 10 are relatively close to each other. Therefore, a tip shape thereof elastically deforms so as to follow the surface shape of the first common wiring 92. Thereby, even if the wiring substrate 30 and the flow path forming substrate 10 have the bending or the undulation, the common core portion 37 deforms following the bending or the undulation. Therefore, it is possible to surely connect the common wiring portion 38 and the first common wiring 92.

The material of the individual wiring portion 36 and the common wiring portion 38 is formed of, for example, a metal or an alloy such as Au, TiW, Cu, chromium (Cr), Ni, Ti, W, NiV, Al, palladium (Pd), lead-free solder. The individual wiring portion 36 and the common wiring portion 38 may be a single layer of these materials, and may be a stacking of plural kinds. The manufacturing method is not specifically limited, but it can be formed by, for example, a sputtering method.

The common through wiring 321 is connected to each of the common wiring portions 38 of the common bump wiring 320. Specifically, the through hole 303 is disposed in the wiring substrate 30, corresponding to each of the common wiring portions 38, and the common through wiring 321 is formed in each of the through holes 303. Each of the common wiring portions 38 is electrically connected to each of the common through wirings 321. The material and the forming method of the common through wiring 321 and the through hole 303 are the same as the individual through wiring 311.

The common surface wiring 322 is a wiring connected to the common through wiring 321 connected to one piezoelectric element row 150A on the first principal surface 301 side of the wiring substrate 30. In the embodiment, two common surface wirings 322 are disposed corresponding to two piezoelectric element rows 150A. Each of the common surface wirings 322 is connected to the plurality of common through wirings 321 disposed in one piezoelectric element row 150A. The common wiring portion 38 of one common bump wiring 320 and the common wiring portion 38 of the other common bump wiring 320 are not electrically connected to each other.

Each of the common surface wirings 322 is provided with a terminal portion 322a which is drawn to the end portion side of the wiring substrate 30 and connected to an external wiring 125. The material and the forming method of the common surface wiring 322 are the same as the individual surface wiring 312.

The second common wiring 32 is provided with the common bump wiring 320, the common through wiring 321, and the common surface wiring 322, which is electrically connected in this manner. A plurality of second common wirings 32 are disposed for each of the two piezoelectric element rows.

The wiring substrate 30 providing the second individual wiring 31 and the second common wiring 32 described above is joined to the flow path forming substrate 10 by an adhesive layer 140. The adhesive layer 140 is disposed on both sides of the individual core portion 35 in the second direction Y. Thereby, the connection state between the individual wiring portion 36 and the first individual wiring 91, and between the common wiring portion 38 and the first common wiring 92 are maintained.

The wiring substrate 30 is joined to the flow path forming substrate 10. Therefore, a supply wiring 39 to which the first common wiring 92 and the second common wiring 32 are connected is formed. The supply wiring 39 is disposed for each of the piezoelectric element rows 150A. In the embodiment, two supply wirings 39 are formed corresponding to the two rows of piezoelectric element rows 150A. The supply wiring 39 is a wiring for supplying a bias voltage to the second electrode 80 common to the piezoelectric elements 150 of each of the piezoelectric element rows 150A.

These supply wirings 39 are not connected to each other. The description that the supply wirings 39 are not connected to each other means a configuration that are not connected at least within the recording head 1. Although the external wiring 125 is connected to the supply wiring 39, it is preferable that the wirings connected to the supply wiring 39 among the wirings included in the external wiring be not connected to each other.

On one end side of the first principal surface 301 of the wiring substrate 30, the terminal portion 322a of the common surface wiring 322 is disposed. A connection wiring 122 is drawn from the driving circuit 120 to one end side of the wiring substrate 30. The terminal portion 322a and a terminal portion 122a of the connection wiring 122 are connected to the external wiring 125.

The external wiring 125 is a wiring connecting the common surface wiring 322 and the connection wiring 122 to a control circuit (not illustrated). A power source of the driving circuit 120, a ground (GND), a control signal, a driving signal for driving the piezoelectric element 150, and the like are supplied from the control circuit to the driving circuit 120 via the external wiring 125 and the connection wiring 122. A bias voltage is supplied from the control circuit to the common surface wiring 322 (supply wiring 39) via the external wiring 125.

The auxiliary wiring 33 is a wiring disposed on the second principal surface 302 of the wiring substrate 30, and connected to each of the second common wirings 32. In the embodiment, one auxiliary wiring 33 is disposed for one second common wiring 32. The auxiliary wiring 33 is buried in a groove portion 330 disposed on the second principal surface 302 of the wiring substrate 30.

The groove portion 330 is formed along the first direction X on the second principal surface 302. Each of the groove portions 330 is disposed outside the common core portion 37 disposed between the two rows of piezoelectric element rows 150A.

The auxiliary wiring 33 is buried in such a groove portion 330. The auxiliary wiring 33 is formed of a metal such as copper (Cu) and can be formed, for example, by a method such as electrolytic plating, electroless plating, printing of a conductive paste, or the like.

The common wiring portion 38 of the common bump wiring 320 configuring the second common wiring 32 is connected to the auxiliary wiring 33. In the embodiment, the plurality of common wiring portions 38 provided in one common bump wiring 320 are connected to one auxiliary wiring 33. The same applies to the other auxiliary wiring 33.

The auxiliary wirings 33 are not connected to each other. The description that the auxiliary wirings 33 are not connected to each other means that the auxiliary wirings 33 disposed for each of the piezoelectric element rows 150A are not connected to each other. That is, the auxiliary wiring 33 corresponding to one piezoelectric element row 150A, and the auxiliary wiring 33 corresponding to the other piezoelectric element row 150A are not connected to each other. In the case where a plurality of auxiliary wirings 33 are provided for one piezoelectric element row 150A, these auxiliary wirings 33 may be connected to each other.

The wiring substrate 30 described above on which the second individual wiring 31, the second common wiring 32, and the auxiliary wiring 33 are disposed is joined to the flow path forming substrate 10 by the adhesive layer 140. Between the flow path forming substrate 10 and the wiring substrate 30, a holding portion 160 which is a space in which the piezoelectric element 150 is disposed is formed.

In the recording head 1 according to the embodiment, the piezoelectric element 150 is accommodated in the holding portion 160, and the driving circuit 120 is disposed on the first principal surface 301 side of the wiring substrate 30. The driving circuit 120 is a so-called face-up arrangement facing the side opposite to the piezoelectric element 150. The piezoelectric element 150 and the driving circuit 120 are electrically connected by the individual through wiring 311 penetrating the wiring substrate 30 and the common through wiring 321. Therefore, in order to install a wiring for connecting the driving circuit 120 mounted on the first principal surface 301 of the wiring substrate 30, and the piezoelectric element 150 disposed on the second principal surface 302 side of the wiring substrate 30, it is possible to reduce the size of the recording head 1 by suppressing the wiring substrate 30 and the flow path forming substrate 10 from becoming larger.

As illustrated in FIGS. 1 to 3, a case member 40 forming a manifold 100 communicating with the plurality of pressure chambers 12 is fixed to such a joined body of the flow path forming substrate 10, the wiring substrate 30, the communicating plate 15, and the nozzle plate 20. The case member 40 has substantially the same shape as the communicating plate 15 described above in plan view, is joined to the wiring substrate 30, and is joined to the communicating plate 15 described above. Specifically, the case member 40 has the recessed portion 41 of a depth that accommodates the flow path forming substrate 10 and the wiring substrate 30 on the wiring substrate 30 side. The recessed portion 41 has an opening area larger than the surface joined to the flow path forming substrate 10 of the wiring substrate 30. In a state where the flow path forming substrate 10 and the like are accommodated in the recessed portion 41, the opening surface of the recessed portion 41 on the nozzle plate 20 side is sealed by the communicating plate 15. The third manifold portion 42 having a recessed shape on both sides in the second direction Y of the recessed portion 41 is formed in the case member 40. The manifold 100 of the embodiment is configured by the third manifold portion 42 and the first manifold portion 17 and the second manifold portion 18 disposed in the communicating plate 15.

As a material of the case member 40, for example, a resin or metal can be used. Incidentally, the case member 40 can be mass-produced at low cost by molding a resin material.

The compliance substrate 45 is disposed on a surface at the nozzle plate 20 side of the communicating plate 15. The compliance substrate 45 seals an opening of the nozzle plate 20 sides of the first manifold portion 17 and the second manifold portion 18. This compliance substrate 45, in the embodiment, is provided with a sealing film 46 and a fixed substrate 47. The sealing film 46 is formed of a thin film having a flexibility (for example, thin film having thickness formed by polyphenylene sulfide (PPS) or stainless steel (SUS) is 20 μm or less), and the fixed substrate 47 is formed of a hard material of the metal such as stainless steel (SUS). Since a region facing the manifold 100 of the fixed substrate 47 is an opening portion 48 which is completely removed in the thickness direction, one side of the manifold 100 is a compliance portion 49 sealed only by the sealing film 46 having a flexibility.

An introduction path 44 to supply the ink to each of the manifolds 100 by communicating with the manifold 100 is disposed in the case member 40. A connection port 43 to which the wiring substrate 30 exposes and in which the external wiring is inserted is disposed in the case member 40, and the external wiring 125 inserted in the connection port 43 is connected to the common surface wiring 322 and the connection wiring 122 of the wiring substrate 30 (refer to FIG. 5).

In the recording head 1 configured in this manner, when ejecting the ink, the ink is absorbed via the introduction path 44 from a liquid storage unit in which the ink is stored, and an internal flow path is filled with the ink from the manifold 100 up to the nozzle 21. Thereafter, the voltage is applied to each of the piezoelectric elements 150 corresponding to the pressure chamber 12 in accordance with the signal from the driving circuit 120. Therefore, the piezoelectric element 150 and the diaphragm 50 are subjected to be flexure deformation. Thereby, the pressure in the pressure chamber 12 increases and an ink droplet is ejected from the predetermined nozzle 21.

In the recording head 1 described above, the supply wiring 39 connected to the second electrode 80 is disposed for each of the piezoelectric element rows 150A formed of the plurality of piezoelectric elements 150 which share the second electrode 80 to which the bias voltage is applied. Since the supply wirings 39 are not connected to each other, it is possible to suppress occurrence of electric crosstalk between the piezoelectric element rows 150A, and to suppress variations in ejection characteristics of ink droplets.

The auxiliary wirings 33 are connected to each of the supply wirings 39. Therefore, it is possible to lower an electric resistance value of the supply wiring 39 to which the auxiliary wiring 33 is connected. The auxiliary wiring 33 is also connected to the supply wiring 39 for each of the piezoelectric element rows 150A. That is, since the auxiliary wirings 33 are not connected to each other, it is possible to suppress the occurrence of the electric crosstalk between the piezoelectric element rows 150A via the auxiliary wirings 33. Thereby, it is possible to suppress the variations in the ejection characteristics of the ink droplets.

Furthermore, the auxiliary wiring 33 is buried in the wiring substrate 30, and is substantially flush with the second principal surface 302. Accordingly, it is possible to reduce the interval between the flow path forming substrate 10 and the wiring substrate 30, compared to the case where the auxiliary wiring 33 is formed on the second principal surface 302. Thereby, it is possible to reduce the size of the recording head 1 in a height direction.

In the embodiment, although the auxiliary wiring 33 is disposed on the second principal surface 302 of the wiring substrate 30, the groove portion may be disposed on the first principal surface 301, and the auxiliary wiring may be formed in the groove portion. In this case, the auxiliary wiring is substantially flush with the first principal surface 301. Accordingly, it is possible to reduce the interval between the wiring substrate 30 and the driving circuit 120, compared to the case where the auxiliary wiring is formed on the first principal surface 301. Thereby, it is possible to reduce the size of the recording head 1 in the height direction.

In the case of forming the auxiliary wiring without disposing the groove portion on the first principal surface 301 or the second principal surface 302, since restrictions are imposed on the interval between the wiring substrate 30 and the flow path forming substrate, and the interval between the wiring substrate 30 and the driving circuit 120, it is difficult to increase the thickness of the auxiliary wiring. Therefore, the cross section of the auxiliary wiring becomes small and the electric resistance value becomes high. When a width of the auxiliary wiring is increased in order to lower the electric resistance value of the auxiliary wiring, the wiring substrate 30 becomes large.

In the invention, since the auxiliary wiring 33 is buried in the groove portion 330, compared to the case where the auxiliary wiring is formed on the first principal surface 301 or the second principal surface 302, it is possible to downsize the wiring substrate 30 and to more effectively reduce the electric resistance value of the supply wiring 39.

The second common wiring 32 has a configuration in which the common bump wiring 320 on the second principal surface 302 side and the common surface wiring 322 on the first principal surface 301 side are connected by the common through wiring 321. Thereby, without drawing the first individual wirings 91 and the first common wirings 92 of the flow path forming substrate 10 from the holding portion 160 to the outside, it is possible to connect the first individual wirings 91 and the first common wirings 92 to the second individual wiring 31 and the second common wiring 32 of the wiring substrate 30. Accordingly, it is possible to reduce the space for forming the first individual wiring 91 and the first common wiring 92 drawn from the holding portion 160 in the flow path forming substrate 10, and it is possible to reduce the size of a XY plane. The same applies to the second individual wiring 31.

In the embodiment, the supply wiring 39 is connected to the auxiliary wiring 33 via the common wiring portion 38. The common wiring portion 38 is connected to the first common wiring 92. That is, the common wiring portion 38 also functions to connect the auxiliary wiring 33 and the supply wiring 39, in addition to connecting the first common wiring 92 and the second common wiring 32. Thereby, it is unnecessary to dispose a separate wiring for connecting the auxiliary wiring 33 to the supply wiring 39, and it is possible to reduce the cost of manufacturing and members.

In the embodiment, the auxiliary wiring 33 is electrically connected to the second common wiring 32 at a plurality of locations via the plurality of common wiring portions 38. Since each of the common wiring portions 38 and the second common wirings 32 are disposed at a predetermined interval in the first direction X, the voltage drop of the second electrode 80 in the first direction X is suppressed, it is possible to suppress the variation of the bias voltage to each of the piezoelectric elements 150. That is, the variation in the bias voltage in each of the piezoelectric element 150 in the piezoelectric element rows 150A is suppressed.

Second Embodiment

In the recording head 1 of the first embodiment, the two core portions of the individual core portion 35 and the common core portion 37 are disposed for one piezoelectric element row 150A, but it is not limited to such an aspect. It may be an aspect using one core portion for one piezoelectric element row 150A.

Figure 9:
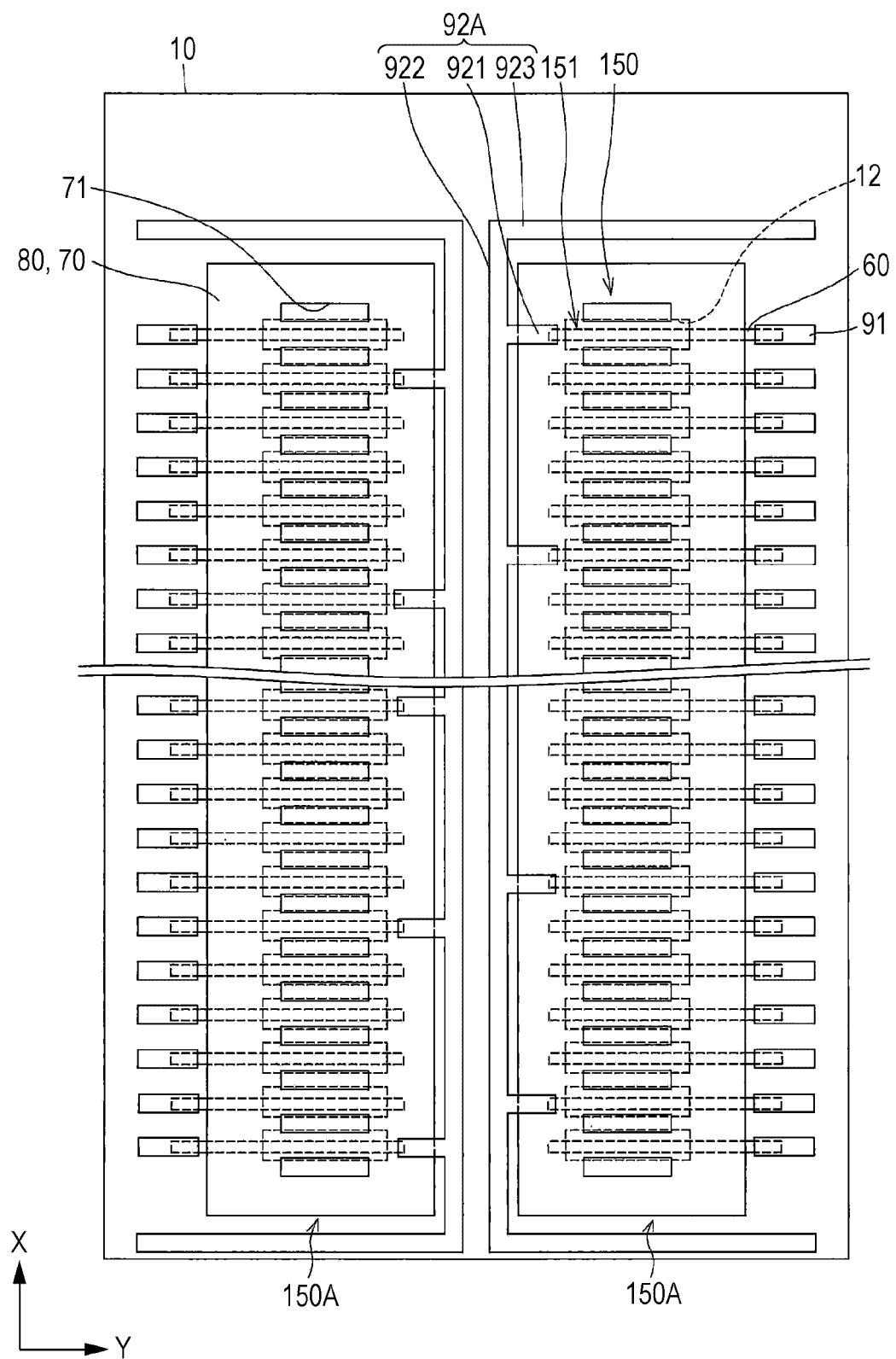
FIG. 9 is a plan view of a flow path forming substrate according to a second embodiment.
Figure 10:
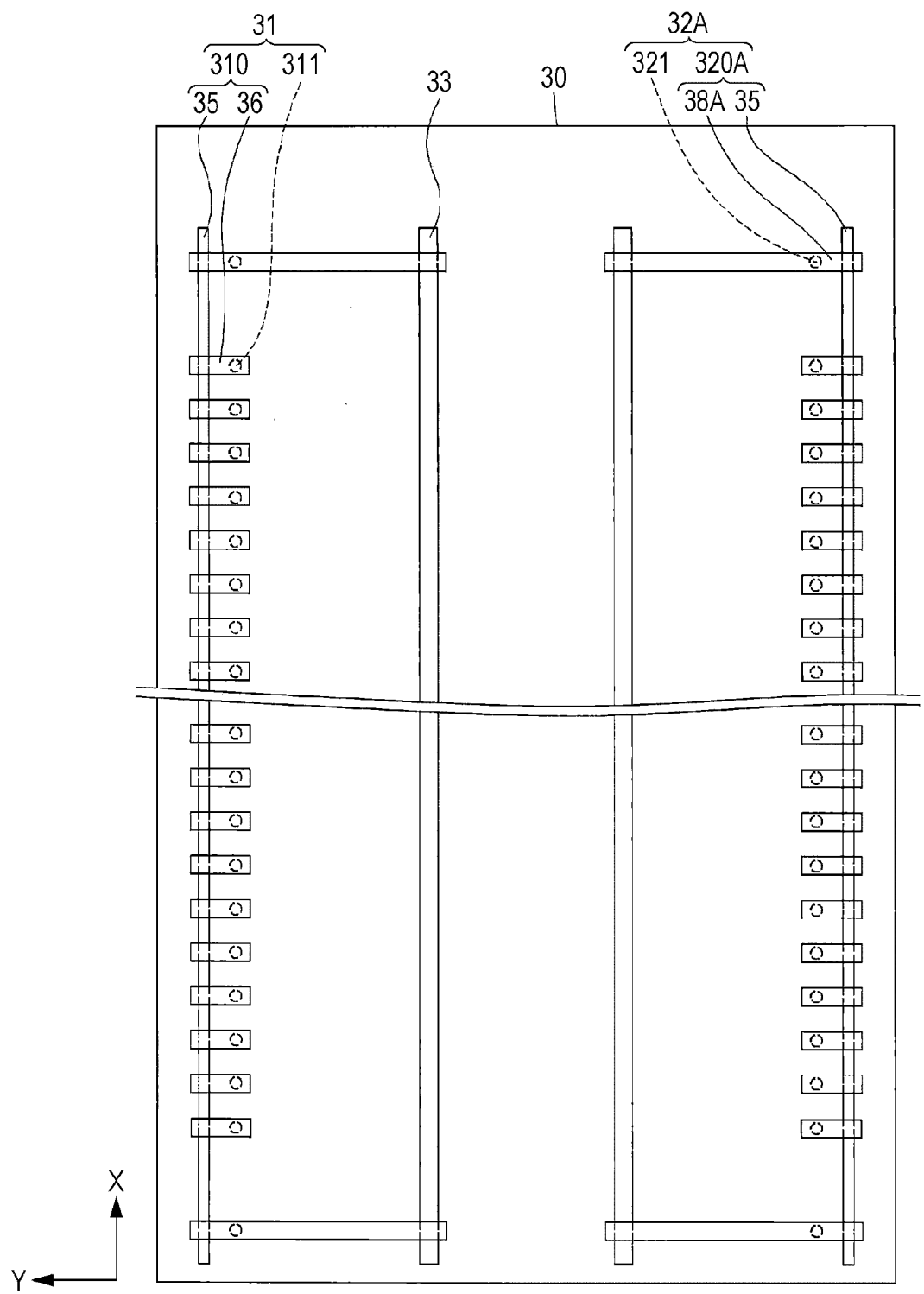
FIG. 10 is a bottom view of a wiring substrate according to the second embodiment.

FIG. 9 is a plan view of the flow path forming substrate, and FIG. 10 is a bottom view of the wiring substrate. The same reference numerals are given to the same components as those in the first embodiment, and redundant descriptions will be omitted.

As illustrated in FIG. 9, the first common wirings 92A are disposed for each of the piezoelectric element rows 150A in the flow path forming substrate 10. The first common wiring 92A is provided with a first wiring portion 921, a second wiring portion 922, and a third wiring portion 923.

The first wiring portion 921 is a wiring drawn from the second electrode 80 toward the space between the piezoelectric element rows 150A along the second direction Y. The number of the first wiring portions 921 is not specifically limited, but in the present embodiment, a plurality of first wiring portions 921 are disposed at predetermined intervals along the first direction X.

The second wiring portion 922 is a wiring extended along the first direction X between the piezoelectric element rows 150A. The length of the second wiring portion 922 in the first direction X is longer than that of the second electrode 80. A plurality of first wiring portions 921 are connected to the second wiring portion 922.

The third wiring portion 923 is a wiring extended along the second direction Y, and two wiring portions are disposed in total, one for each side of the second electrode 80 in the first direction X. One end of the third wiring portion 923 is connected to the second wiring portion 922. The other end of the third wiring portion 923 is disposed such that the position in the second direction Y is substantially aligned with the first individual wiring 91. As described later, the other end of the third wiring portion 923 is disposed at a position opposed to the individual core portion 35.

In this manner, the first common wiring 92A is not extended between the piezoelectric element rows 150A, but extended to the outside of the piezoelectric element rows 150A.

As illustrated in FIG. 10, the individual core portion 35 is disposed, and the common core portion 37 is not disposed in the wiring substrate 30. In the common bump wiring 320A configuring the second common wiring 32A, the common wiring portion 38A is extended to the individual core portion 35. That is, one end of the common wiring portion 38A is connected to the auxiliary wiring 33, and the other end partially covers the front surface of the individual core portion 35. A portion covering the individual core portion 35 of the common wiring portion 38A is disposed so as to face the third wiring portion 923 illustrated in FIG. 9.

In such a state where the flow path forming substrate 10 and the wiring substrate 30 are joined to each other, the common wiring portion 38A is connected to the first common wiring 92A (third wiring portion 923) on the individual core portion 35.

In this manner, in the recording head 1 of the embodiment, one individual core portion 35 connects the first individual wiring 91 and the second individual wiring 31 (individual wiring portion 36), and connects the first common wiring 92A and the second common wiring 32A (common wiring portion 38).

The individual core portion 35 is disposed outside the two rows of the piezoelectric element rows 150A. On the other hand, the common core portion 37 is not disposed between the piezoelectric element rows 150A. Thereby, it is possible to reduce the interval of the piezoelectric element rows 150A and it is possible to reduce the size of the recording head 1 in the XY plane.

Other Embodiment

Hereinbefore, although each of the embodiments of the invention is described, the basic configuration of the invention is not limited to the embodiments described above.

In the first embodiment, the piezoelectric element rows 150A are used in two rows, but three or more rows may be used. That is, in an aspect in which the individual core portion 35 and the common core portion 37 are used for one piezoelectric element row 150A, it not limited to two rows, three or more rows of piezoelectric element rows 150A may be disposed.

Although the second individual wiring 31 is provided with the individual bump wiring 310, the individual through wiring 311, and the individual surface wiring 312 in the first embodiment, it is not limited to such an aspect. For example, the second individual wiring may be disposed on the first principal surface 301 of the wiring substrate 30 and one end thereof may be a configuration connected to the driving circuit 120.

On the other hand, the first individual wiring 91 is drawn from the first electrode 60 and extended to the outside of the holding portion 160. Each of the first individual wirings 91 may be connected to the second individual wiring 31 on the wiring substrate 30 by wire bonding or the like.

The same applies to the second common wiring 32. That is, although the second common wiring 32 is provided with the common bump wiring 320, the common through wiring 321, and the common surface wiring 322, it is not limited to such an aspect. For example, the second common wiring may be disposed on the first principal surface 301 of the wiring substrate 30 and one end thereof may be a configuration connected to the external wiring 125.

On the other hand, the first common wiring 92 is drawn from the second electrode 80 and extended to the outside of the holding portion 160. Each of the first common wiring 92 may be connected to the second common wiring on the wiring substrate 30 by the wire bonding or the like.

Although the electrical connection between the first individual wiring 91 and the second individual wiring 31, and between the first common wiring 92 and the second common wiring 32 are performed by the individual bump wiring 310 and the common bump wiring 320 in the first embodiment, it is not limited thereto. For example, these wirings may be electrically connected using a metal bump, a solder, an anisotropic conductive adhesive (ACP, and ACF), and a nonconductive adhesive (NCP, and NCF). A configuration connecting the terminal 121 of the driving circuit 120 and the individual surface wiring 312 can also be connected by the same means.

Figure 11:
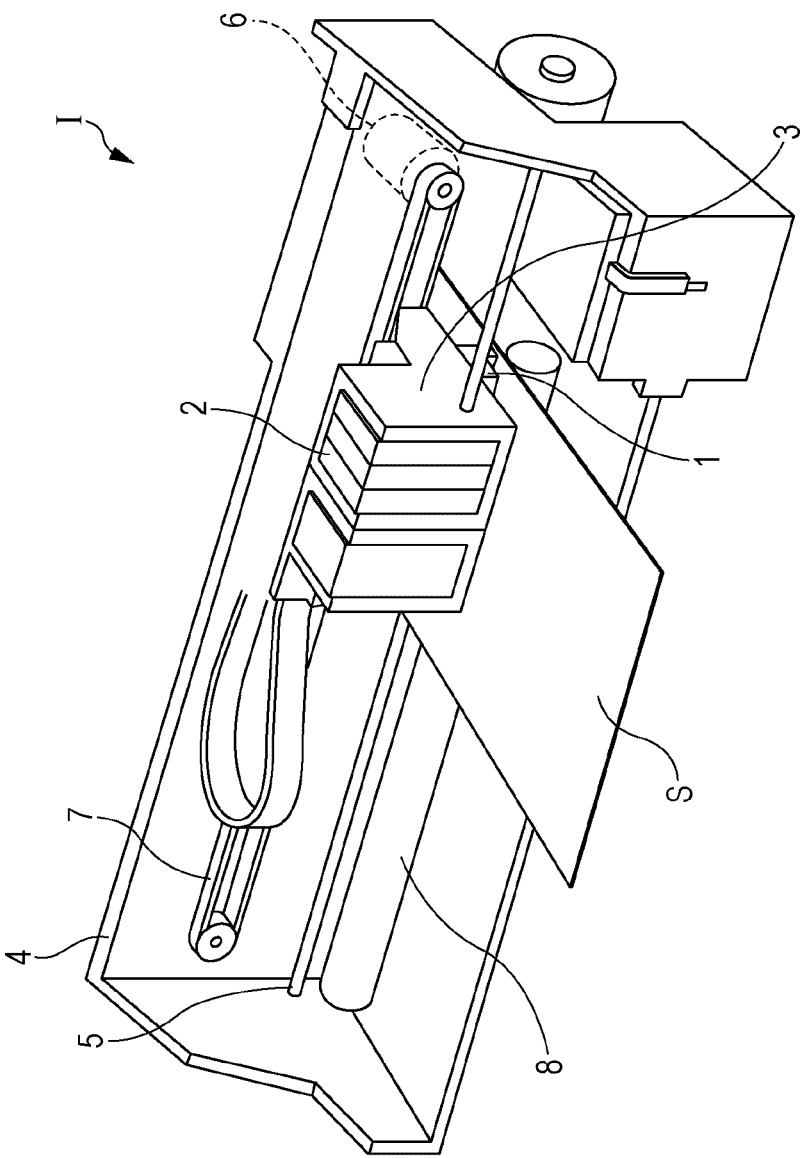
FIG. 11 is a schematic view illustrating an example of an ink jet recording apparatus.

The recording head 1 of the first embodiment and the second embodiment is mounted on an ink jet recording apparatus which is an example of a liquid ejecting apparatus. FIG. 11 is a schematic view illustrating an example of an ink jet recording apparatus.

In the ink jet recording apparatus I, the recording head 1 is detachably disposed with a cartridge 2 configuring an ink supply means, and the carriage 3 on which the recording head 1 is mounted is disposed so as to be movable in an axial direction on a carriage shaft 5 attached to the apparatus main body 4.

A driving force of a driving motor 6 is transmitted to the carriage 3 through a plurality of gears (not illustrated) and the timing belt 7. Therefore, the carriage 3 on which the recording head 1 is mounted is moved along the carriage shaft 5. On the other hand, a transport roller 8 as a transporting means is disposed in the apparatus main body 4, and a recording sheet S which is a recording medium such as paper is transported by the transport roller 8. The transport means for transporting the recording sheet S is not limited to the transport roller, and may be a belt, a drum, or the like.

As the ink jet recording apparatus I, although the recording head 1 is mounted on the carriage 3 and moves in a main scanning direction, the configuration is not specifically limited. The ink jet recording apparatus I, for example, may be a so-called line type recording apparatus that fixes the recording head 1 and performs printing by moving a recording sheet S such as paper in a sub scanning direction.

In the ink jet recording apparatus I, although the cartridge 2 functioning as a liquid storage means is mounted on the carriage 3, it is not specifically limited thereto. For example, a liquid storage means such as an ink tank may be fixed to the apparatus main body 4 and the liquid storage means and the recording head 1 may be connected via a supply pipe such as a tube. The liquid storage means may not be mounted on the ink jet recording apparatus I.

In the above embodiment, although an ink jet recording head is described as an example of the liquid ejecting head and an ink jet recording apparatus is described as an example of the liquid ejecting apparatus, the invention is broadly applied to the liquid ejecting head and the liquid ejecting apparatus in general, and can be certainly applied to the liquid ejecting head and the liquid ejecting apparatus that eject liquids other than ink. Examples of other liquid ejecting heads, for example, include various recording heads used in an image recording apparatus such as a printer, a color material ejecting head used for manufacturing a color filter such as a liquid crystal display, an organic EL display, an electrode material ejecting head used for forming an electrode such as a field emission display (FED), a bioorganic material ejecting head used for manufacturing a bio chip, and the like, and can be applied to the liquid ejecting apparatus providing such a liquid ejecting head.

The invention can be applied not only to the liquid ejecting head represented by the ink jet recording head but also to other piezoelectric devices such as an ultrasonic device of an ultrasonic transmitter, an ultrasonic motor, a pressure sensor, and a pyroelectric sensor. Even in such a piezoelectric element device, electric crosstalk is suppressed and downsizing can be realized.

What is claimed is:

1. A piezoelectric device comprising:
an actuator substrate that includes a plurality of piezoelectric element rows having a plurality of piezoelectric elements; and
a wiring substrate that is disposed so as to face the actuator substrate,
wherein the piezoelectric element rows include a common electrodes common to the plurality of piezoelectric elements,
wherein the actuator substrate includes a plurality of first common wirings connected to each of the common electrodes of the plurality of piezoelectric element rows,
wherein the wiring substrate includes a plurality of second common wirings connected to each of the first common wirings of the plurality of piezoelectric element rows, and a plurality of auxiliary wirings buried in a groove portion formed in the wiring substrate, and
wherein the auxiliary wirings are connected to each of the second common wirings, and the plurality of auxiliary wirings are not connected to each other.

2. The piezoelectric device according to claim 1,
wherein the second common wiring includes a first principal surface side wiring disposed on a first principal surface of the wiring substrate opposite to the actuator substrate, a second principal surface side wiring disposed on a second principal surface of the wiring substrate on the actuator substrate side, and a through wiring formed in a through hole penetrating the wiring substrate in a thickness direction and connected to the first principal surface side wiring and the second principal surface side wiring, and
wherein the auxiliary wiring is disposed on at least one of the first principal surface or the second principal surface and connected to the first principal surface side wiring or the second principal surface side wiring.

3. The piezoelectric device according to claim 2,
wherein the second principal surface side wiring includes a common core portion that is disposed on the second principal surface and extended in a first direction, and a common wiring portion that covers at least a portion of the common core portion and is connected to the first common wiring, and
wherein the auxiliary wiring is disposed on the second principal surface and connected to the common wiring portion.

4. A liquid ejecting head comprising the piezoelectric device according to claim 3.

5. A liquid ejecting apparatus comprising the liquid ejecting head according to claim 4.

6. The piezoelectric device according to claim 2,
wherein the actuator substrate includes a plurality of first individual wirings that are connected to each of a plurality of individual electrodes disposed for each of the piezoelectric elements,
wherein the wiring substrate includes a plurality of second individual wirings that are connected to each of the plurality of first individual wirings,
wherein the second individual wiring includes an individual core portion that is disposed on the second principal surface and extended in the first direction, and an individual wiring portion that covers at least a portion of the individual core portion and is connected to the first individual wiring,
wherein the first individual wirings connected to the plurality of piezoelectric elements for each of the piezoelectric element rows are connected to the individual wiring portions, and wherein the second principal surface side wiring covers at least a portion of the individual core portion, and includes the common wiring portion connected to the first common wiring.

7. A liquid ejecting head comprising the piezoelectric device according to claim 6.

8. A liquid ejecting apparatus comprising the liquid ejecting head according to claim 7.

9. A liquid ejecting head comprising the piezoelectric device according to claim 2.

10. A liquid ejecting apparatus comprising the liquid ejecting head according to claim 9.

11. A liquid ejecting head comprising the piezoelectric device according to claim 1.

12. A liquid ejecting apparatus comprising the liquid ejecting head according to claim 11.

* * * * *